United States Patent
Liaw et al.

[11] Patent Number: 6,020,267
[45] Date of Patent: Feb. 1, 2000

[54] METHOD FOR FORMING LOCAL INTERCONNECT METAL STRUCTURES VIA THE ADDITION OF A TITANIUM NITRIDE ANTI-REFLECTIVE COATING

[75] Inventors: Jhon-Jhy Liaw, Taipei; Ching-Yau Yang, Chang Hua, both of Taiwan

[73] Assignee: Taiwan Semiconductor Manufacturing Company, Ltd., Hsin-Chu, Taiwan

[21] Appl. No.: 09/039,499

[22] Filed: Mar. 16, 1998

[51] Int. Cl.[7] .................................................. C23C 16/42
[52] U.S. Cl. .......................... 438/694; 438/695; 438/696; 438/700; 438/703
[58] Field of Search .................................... 438/694, 695, 438/696, 700, 703

[56] References Cited

U.S. PATENT DOCUMENTS

| 5,360,995 | 11/1994 | Grass | 257/751 |
|---|---|---|---|
| 5,403,781 | 4/1995 | Matsumoto et al. | 437/195 |
| 5,449,639 | 9/1995 | Wei et al. | 437/187 |
| 5,451,543 | 9/1995 | Woo et al. | 437/195 |
| 5,451,551 | 9/1995 | Kirshnan et al. | 437/241 |
| 5,641,710 | 6/1997 | Wang et al. | 438/643 |
| 5,801,096 | 9/1998 | Lee et al. | 438/636 |

*Primary Examiner*—Benjamin Utech
*Assistant Examiner*—Vanessa Perez Ramos
*Attorney, Agent, or Firm*—George O. Saile; Stephen B. Ackerman

[57] ABSTRACT

A method for fabricating local interconnect metal structures, overlying metal filled via hole openings, has been developed. This invention features the creation of an aluminum based interconnect structure, comprised with an underlying titanium nitride layer. The titanium nitride layer overlays a metal filled via hole, during a photolithographic exposure that is used for formation of the photoresist shapes that are needed for local interconnect metal structure patterning. The anti-reflective properties of the titanium nitride layer allow the formation of the resulting photoresist shapes to be defined without interfering reflections from the underlying metal plug.

20 Claims, 4 Drawing Sheets

METHOD FOR FORMING LOCAL INTERCONNECT METAL STRUCTURES VIA THE ADDITION OF A TITANIUM NITRIDE ANTI-REFLECTIVE COATING

BACKGROUND OF THE INVENTION (1) Field of the Invention

The present invention relates to a method used to fabricate a semiconductor device, and more specifically to a method used to improve the integrity of local interconnect metal structures.

(2) Description of Prior Art

Static random access memory, (SRAM), cells are usually designed to include six metal oxide semiconductor field effect transistors, (MOSFET), usually four N channel, and two P channel, MOSFETs. The SRAM performance and cost objectives have been successfully addressed by the ability of the semiconductor industry to fabricate SRAM devices, using sub-micron features. The smaller features result in a decrease in performance degrading capacitances and resistances, while also allowing a greater number of smaller SRAM chips, to be obtained from a specific size starting substrate, thus reducing the manufacturing cost of a specific SRAM chip. However the increased density of SRAM chips, does result in difficulties for specific semiconductor fabrication disciplines. For example SRAM interconnect metal structures, are now more tightly packed than in prior technologies, in which sub-micron features were not used for the larger SRAM devices. Therefore photolithographic exposures, used to create sub-micron images in masking photoresist layers, have to be carefully designed and performed. One specific photolithographic sequence, adversely influenced by tighter spaced, metal interconnect structures, is the area in which metal interconnect structures are formed overlying metal filled, via holes. The reflection from a metal filled via hole, during photolithographic exposures, can result in the unwanted exposure of adjacent photoresist shapes, leading to yield and reliability problems. These problems result from undesirable metal interconnect shapes, created using masking photoresist shapes, that were adversely influenced by unwanted reflections, during the photolithographic exposure.

This invention will describe a process in which a second titanium nitride layer is used as a component of a local metal interconnect structure, and provides the needed anti-reflective coating, (ARC), layer, needed for high density SRAM fabrication. A first titanium nitride layer is used as a barrier layer, underlying the metal in the via hole. The titanium nitride, ARC layer, used in this invention, is placed overlying a metal filled via hole, and underlying a metal interconnect layer. Subsequent patterning results in a local metal interconnect structure, comprised of a metal layer and the underlying titanium nitride layer, both overlying the metal filled via hole. Prior art, such as Wei, et al, in U.S. Pat. No. 5,449,639, describe a process in which a titanium nitride layer is also used an ARC layer. However Wei et al, use the ARC layer over an interconnect metal structure, where this application uses the ARC layer underlying a metal interconnect structure, and more importantly overlying a tungsten filled via hole, thus restricting unwanted reflections from a tungsten filled via hole, during a photolithographic exposure procedure.

SUMMARY OF THE INVENTION

It is an object of this invention to create a metal interconnect structure for a SRAM cell.

It is another object of this invention to use a metal filled via hole to connect an overlying local metal interconnect structure, to an underlying region of the semiconductor substrate.

It is still another object of this invention to use a titanium nitride layer as an underlying component of the local metal interconnect structure, to restrict unwanted reflections from metal filled via holes, occurring during the photolithographic exposure used to create the photoresist shape, needed as a mask during the patterning of the local metal interconnect structure.

In accordance with the present invention a method for restricting the unwanted reflections originating from a metal filled via hole, during a photolithographic exposure procedure, via the use of a titanium nitride, ARC layer, placed directly overlying the metal filled via hole, has been developed. A via hole is opened in an insulator layer, exposing the top surface of a semiconductor region. A composite metal layer of titanium, used as an adhesive layer, and of a first titanium nitride layer, used as barrier layer, is deposited, coating the sides of the via hole. A layer of tungsten is next deposited, completely filling the via hole. A tungsten plug, in the via hole, is next established by removal of regions of unwanted tungsten from the underlying metal composite layer, in a region in which the metal composite layer resided on the top surface of the insulator layer. A second titanium nitride layer, needed for use as an ARC layer, is deposited, completely covering the tungsten filled via hole, followed by the deposition of a metal interconnect layer. Patterning of the metal interconnect layer, of the second titanium nitride layer, and of the composite metal layer, via photolithographic and dry etching procedures, creates the local metal interconnect structure, overlying and contacting a tungsten filled via hole.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The process for creating a local interconnect metal structure, incorporating a titanium nitride, ARC layer, between an overlying metal interconnect layer and an underlying metal filled via hole, will now be described in detail. The local interconnect metal structure, described in this invention, will be used in SRAM designs, comprised of complimentary MOSFET devices, (N channel as well as P channel devices). However the local interconnect metal structure, of this invention, can be used for designs other than SRAM. In addition, although this invention describes the local interconnect metal structure, applied to N channel MOSFET devices, it can also be applied to P channel MOSFET devices.

Figure 1:
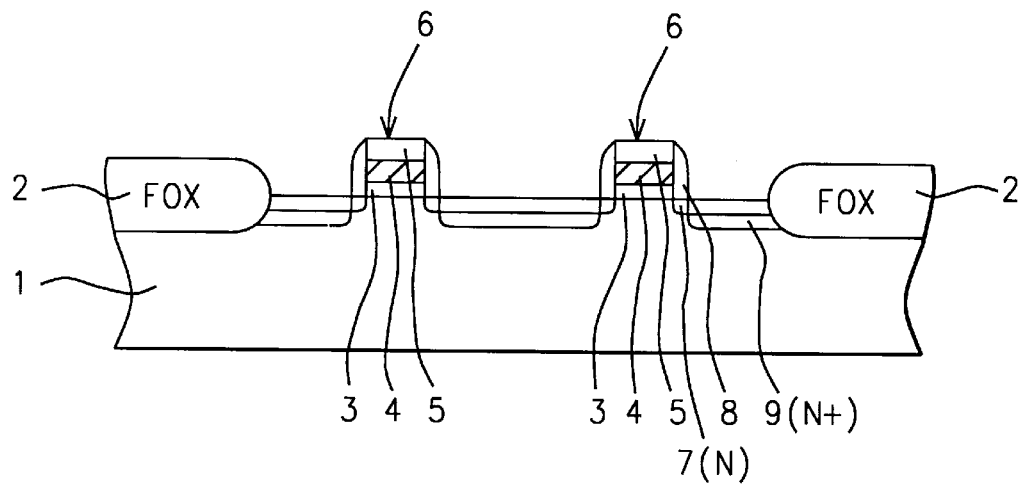
FIGS. 1, 2, 3, 4, 5, 6, and 7, which schematically, in cross-sectional style, show key stages of fabrication used to create a local interconnect metal structure, used in a SRAM cell, overlying a metal filled via hole.

A P type, single crystalline, silicon substrate 1, with a <100> crystallographic orientation, is used, and shown schematically in FIG. 1. Field oxide, (FOX), regions 2, formed for isolation purposes, are thermally grown to a thickness between about 3000 to 5000 Angstroms, using thermal oxidation procedures. Subsequent device regions are protected from the FOX oxidation procedure by oxidation resistant masking patterns, comprised of a silicon nitride-silicon oxide composite masking layer. After removal of the composite, oxidation resistant mask, a thin gate, silicon dioxide layer 3, is thermally grown, in an oxygen steam ambient, at a temperature between about 800 to 1000° C., to a thickness between about 35 to 150 Angstroms. Next a layer of polysilicon 4, is deposited using low pressure chemical vapor deposition, (LPCVD), procedures, at a temperature between about 500 to 700° C., to a thickness between about 500 to 2500 Angstroms. Polysilicon layer 4, can be in situ doped during, via the addition of phosphine, or arsine, to a silane ambient, or polysilicon layer 4, can be deposited intrinsically and doped via an ion implantation procedure, using arsenic or phosphorous ions. A first silicon oxide layer 5, is next deposited using either LPCVD or plasma enhanced chemical vapor deposition, (PECVD), procedures, at a temperature between about 350 to 750° C., to a thickness between about 1000 to 3000 Angstroms, using tetraethylorthosilicate, (TEOS), as a source.

Conventional photolithographic and reactive ion etching, (RIE), procedures, using $CHF_3$ as an etchant for first silicon oxide layer 5, and $Cl_2$ as an etchant for polysilicon layer 4, are used to create silicon oxide capped, polysilicon gate structure 6, schematically shown schematically in FIG. 1. After photoresist removal via plasma oxygen ashing and careful wet cleans, a lightly doped source and drain region 7, is next created via ion implantation of phosphorous or arsenic, at an energy between about 25 to 75 KeV, at a dose between about 5E11 to 5E13 atoms/$cm^2$. A second silicon oxide layer is deposited, again via use of either LPCVD or PECVD procedures, at a temperature between about 350 to 750° C., to a thickness between about 1500 to 4000 Angstroms, using TEOS as a source, followed, by an anisotropic RIE procedure, using $CHF_3$ as an etchant, to create insulator spacers 8. Insulator spacers 8, can also be comprised of silicon nitride. Heavily doped source and drain regions 9, are then produced via ion implantation of either arsenic or phosphorous, at an energy between about 30 to 100 KeV, at a dose between about 1E14 to 1E16 atoms/$cm^2$. This region is also shown schematically in FIG. 1.

Figure 2:
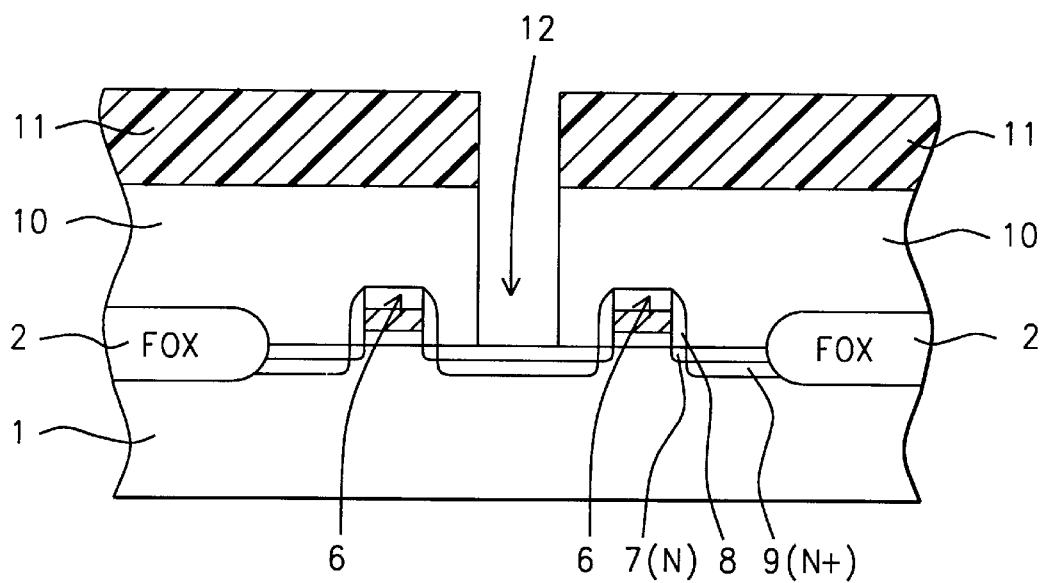

Composite insulator layer 10, is next deposited using PECVD procedures. Composite insulator layer 10, is comprised of an underlying layer of silicon oxide, deposited using PECVD procedures, using TEOS as a source, to a thickness between about 1000 to 2000 Angstroms. Composite insulator layer 10, is also comprised of an overlying layer of BPSG, (boro-phosphosilicate glass), again deposited using PECVD procedures, to a thickness between about 3000 to 12000 Angstroms, using TEOS as a source, and adding phosphine and diborane to the ambient to create the BPSG overlying insulator layer. A reflow procedure, performed at a temperature between about 750 to 900° C., is employed to create a smooth top surface topology. Photoresist shape 11, is formed, and used as a mask to allow the creation of via hole opening 12, in composite insulator layer 10, via an anisotropic RIE procedure using $CHF_3$ as an etchant, exposing the top surface of heavily doped source and drain region 9. This is schematically shown in FIG. 2.

Figure 3:
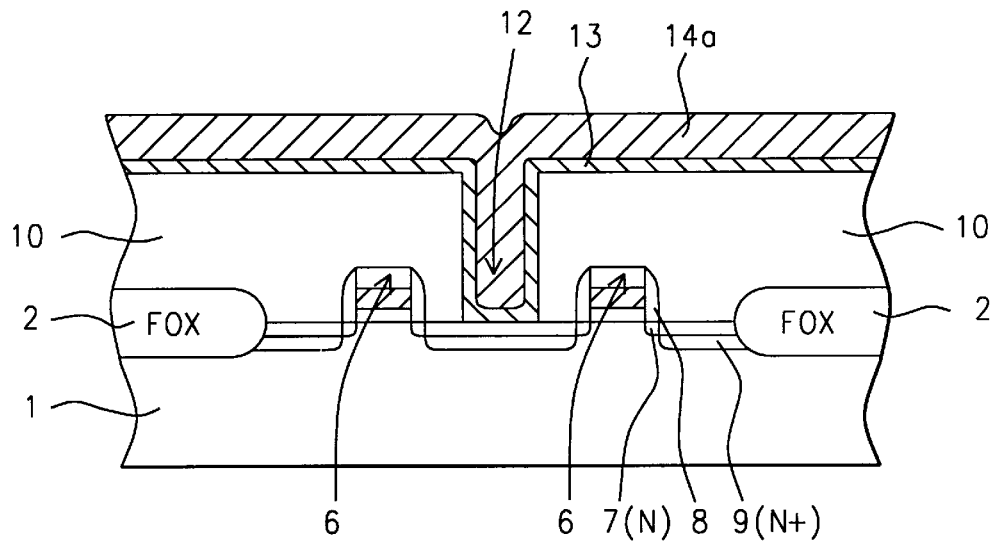
Figure 4:
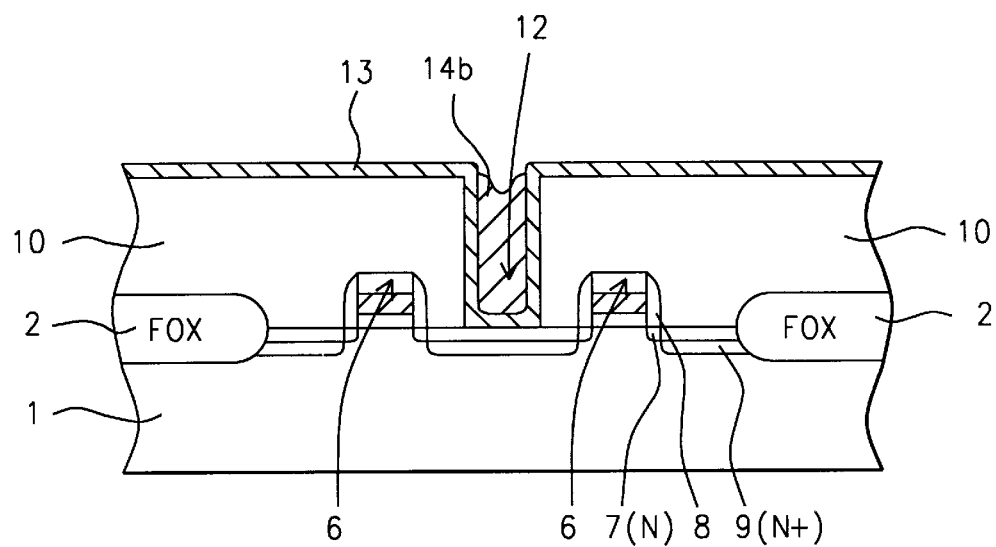

A composite metal layer 13, is next deposited on the exposed sides of via hole opening 12, and on the top surface of composite insulator layer 10. Composite metal layer 13, is comprised of an underlying layer of titanium, deposited using R.F. sputtering, to a thickness between about 200 to 400 Angstroms, and used to improve contact between subsequent overlying metal layers and the underlying heavily doped source and drain region 9, and also used to improve adhesion of subsequent overlying metal layers, to underlying composite insulator layer 10. Composite metal layer 13, is also comprised of an overlying, first titanium nitride layer, deposited using R.F. sputtering, to a thickness between about 600 to 1500 Angstroms, and used as a barrier layer to protect underlying materials from the reactants, and reaction products, of a subsequent tungsten deposition. A tungsten layer 14a, is next deposited, using LPCVD procedures, to a thickness between about 3000 to 7000 Angstroms, at a temperature between about 400 to 600° C., completely filling via hole opening 12. The result of these depositions is schematically shown in FIG. 3. An anisotropic RIE procedure, using $SF_6$ as an etchant, is used to remove tungsten layer 14a, from the top surface of composite metal layer 13, in a region in which composite metal layer 13, overlaid the top surface of composite insulator layer 10, resulting in the formation of tungsten plug 14b, in via hole opening 12. This is schematically shown in FIG. 4

Figure 5:
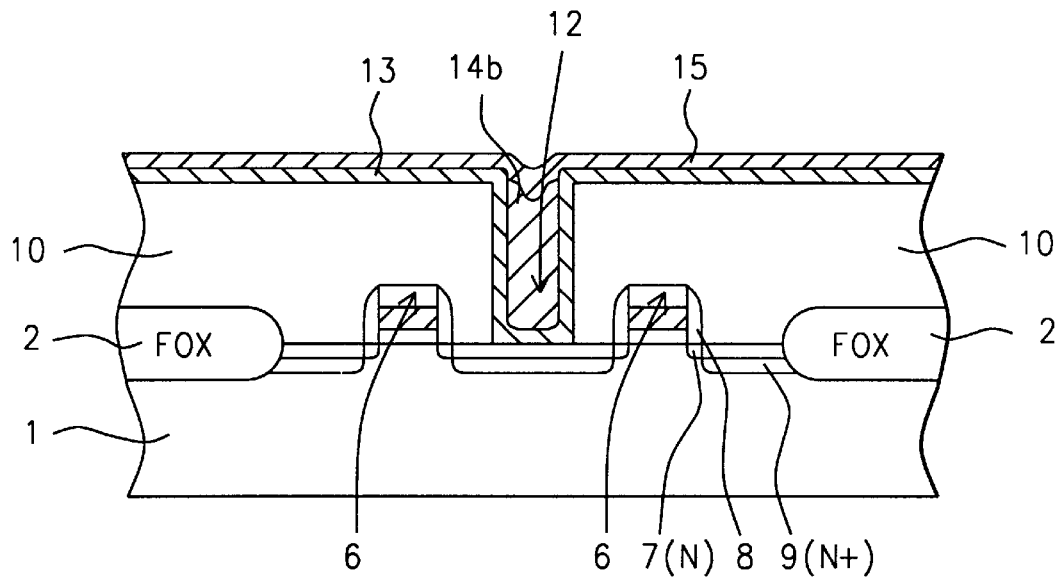
Figure 6:
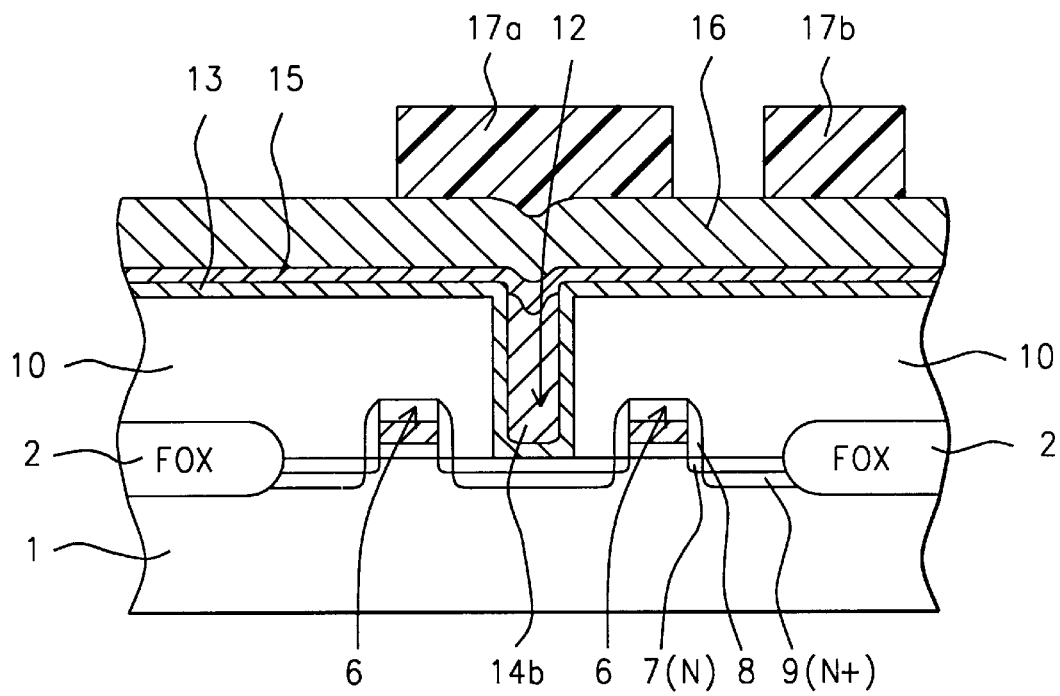

A critical, second titanium nitride layer 15, shown schematically in FIG. 5, is next deposited, via R.F. sputtering, to a thickness between about 300 to 1000 Angstroms. Second titanium layer 15, completely covering tungsten plug 14b, will serve as an anti-reflective coating, preventing reflections from tungsten plug 14b, created during a subsequent photolithographic exposure procedure, from adversely influencing the integrity of resulting photoresist shapes. A interconnect metal layer 16, comprised of aluminum, with between about 0 to 2% copper, is next deposited, via R.F. sputtering, to a thickness between about 2000 to 6000 Angstroms. This is shown schematically in FIG. 6. Photoresist shape 17a, and 17b, are formed via a photolithographic exposure, and photoresist development procedures. The use of second silicon nitride layer 15, preventing reflections from tungsten plug 14b, from exposing regions of photoresist shape 17a, and 17b, thus enabling the desired photoresist shapes to be formed. This is also shown schematically in FIG. 6.

Figure 7:
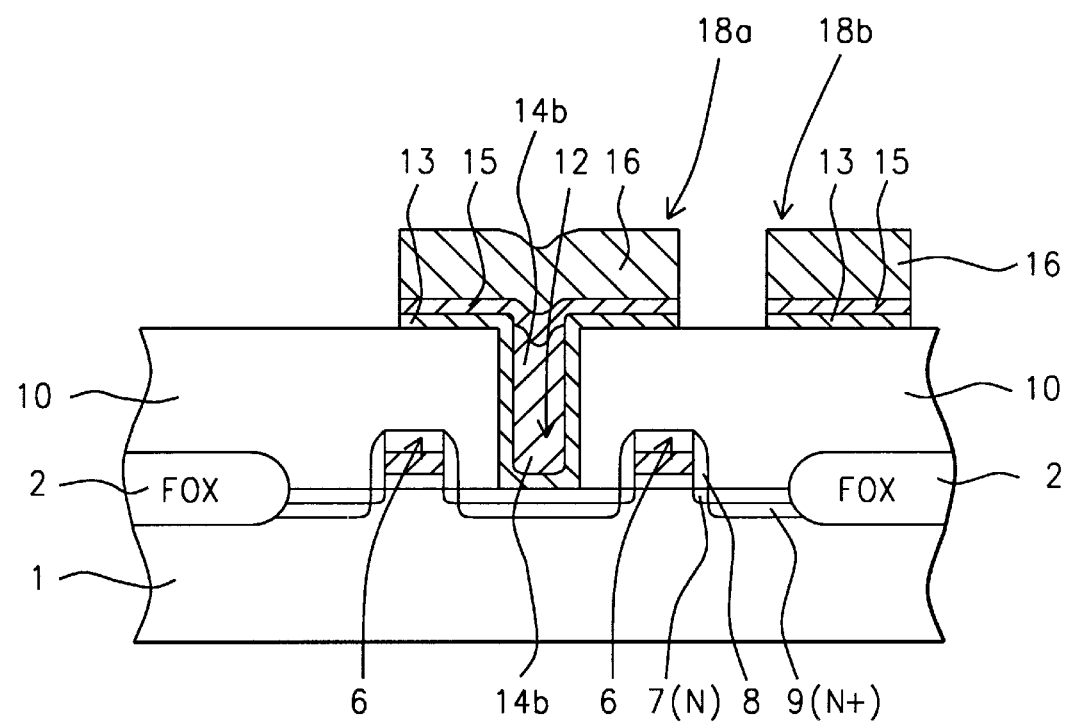

An anisotropic RIE procedure, using $Cl_2$ as an etchant, and using photoresist shapes 17a, and 17b, as a mask, is used to remove unwanted regions of interconnect metal layer 16, unwanted regions of second titanium nitride layer 15, and composite metal layer 13, resulting in local interconnect metal structure 18a, contacting the semiconductor substrate via tungsten plug 14b. Local interconnect metal structure 18b, comprised of interconnect metal layer 16, second titanium nitride layer 15, and composite metal layer 13, is also created during this anisotropic RIE procedure. This is schematically shown in FIG. 7. The ability to form the desired configuration for the local interconnect metal structures, and to form the desired spacing between them, is positively influenced by the integrity of photoresist shapes 17a, and 17b, which in turn were formed using a photolithographic exposure procedure, using second titanium nitride layer 15, as an anti-reflective layer. Photoresist shapes 17a, and 17b, are removed using plasma oxygen ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a local interconnect metal structure, on a semiconductor substrate, using an anti-reflective coating, as part of the local interconnect metal structure, comprising the steps of:

providing transfer gate transistors, comprised of polysilicon gate structures, on a thin gate insulator layer, and comprised of source and drain regions, in said semiconductor substrate, between said polysilicon gate structures;

forming a via hole opening, in a composite insulator layer, exposing a source and drain region;

depositing a composite metal layer on the sides of said via hole opening, and on the top surface of said composite insulator layer;

forming a metal plug in said via hole opening, with said metal plug residing on the portion of said composite metal layer that is located on the sides of said via hole opening;

depositing said anti-reflective coating on the top surface of said metal plug, and on the portion of said composite metal layer, not covered by said metal plug;

depositing a metal interconnect layer on the top surface of said anti-reflective coating; and patterning of said metal interconnect layer, of said anti-reflective coating, and of said composite metal layer, to form said local interconnect metal structure, contacting underlying, said metal plug, in said via hole opening.

2. The method of claim 1, wherein said composite insulator layer is comprised of an underlying silicon oxide layer, deposited to a thickness between about 1000 to 2000 Angstroms, via PECVD procedures, using TEOS as a source, and comprised of an overlying boro-phosphosilicate layer, deposited using PECVD procedures, and TEOS as a source, to a thickness between about 3000 to 12000 Angstroms.

3. The method of claim 1, wherein said via hole opening, in said composite insulator layer, is created via an anisotropic RIE procedure, using $CHF_3$ as a source.

4. The method of claim 1, wherein said composite metal layer is comprised of an underlying titanium layer, deposited via R.F. sputtering, to a thickness between about 200 to 400 Angstroms, and an overlying, first titanium nitride layer, deposited using R.F. sputtering, to a thickness between about 600 to 1500 Angstroms.

5. The method of claim 1, wherein said metal plug is comprised of tungsten, obtained via LPCVD deposition of a tungsten layer, at a temperature between about 400 to 600° C., and to a thickness between about 3000 to 7000 Angstroms.

6. The method of claim 1, wherein said metal plug, in said via hole opening, is formed using anisotropic etching of a tungsten layer, using $SF_6$ as an etchant.

7. The method of claim 1, wherein said anti-reflective coating is a second titanium nitride layer, deposited using R.F. sputtering, to a thickness between about 300 to 1000 Angstroms.

8. The method of claim 1, wherein said metal interconnect layer is an aluminum based layer, deposited using R.F. sputtering, to a thickness between about 2000 to 6000 Angstroms, and containing between about 0 to 2% copper.

9. The method of claim 1, wherein said local interconnect metal structure is formed via an anisotropic RIE procedure, applied to said metal interconnect layer, to said anti-reflective coating, and to said composite metal layer, using $Cl_2$ as an etchant.

10. A method for forming a local interconnect metal structure for a SRAM cell, on a semiconductor substrate, contacting an underlying tungsten plug, and with said local interconnect metal structure comprised of an underlying layer of titanium nitride, used as an anti-reflective coating, comprising the steps of:

providing underlying SRAM transfer gate transistors, comprised of polysilicon gate structures on a gate insulator layer, and with source and drain regions, in said semiconductor substrate, between said polysilicon gate structures;

depositing an insulator layer;

forming a via hole opening in said insulator layer, exposing a source and drain region;

depositing a titanium layer on the top surface of said insulator layer, and on exposed surfaces of said via hole opening;

depositing a first titanium nitride layer, on said titanium layer;

depositing a tungsten layer, on said first titanium nitride layer, completely filling said via hole opening;

performing a blanket, anisotropic reactive ion etching procedure to form said tungsten plug, in said via hole opening, by removing regions of said tungsten layer from the top surface of said first titanium nitride layer, in a region in which first titanium nitride layer, and said titanium layer, overlays the top surface of said insulator layer;

depositing a second titanium nitride layer, on the top surface of said tungsten plug, and on the portion of said second titanium nitride layer that is not covered by said tungsten plug;

depositing an aluminum based metal layer on the top surface of said second titanium nitride layer; and patterning of aluminum based layer, of said second titanium nitride layer, of said first titanium nitride layer, and of said titanium layer, to form said local interconnect metal structure, contacting underlying said tungsten plug, in said via hole opening.

11. The method of claim 10, wherein said insulator layer is comprised of an underlying silicon oxide layer, deposited using PECVD procedures, using TEOS as a source, to a thickness between about 1000 to 2000 Angstroms, and comprised of an overlying boro-phosphosilicate layer, deposited using PECVD procedures, using TEOS as a source, to a thickness between about 3000 to 12000 Angstroms.

12. The method of claim 10, wherein reflow of said insulator layer is performed at a temperature between about 750 to 900° C.

13. The method of claim 10, wherein said via hole opening, in said insulator layer, is formed via an anisotropic RIE procedure, using $CHF_3$ as an etchant.

14. The method of claim 10, wherein said titanium layer is deposited using R.F. sputtering, to a thickness between about 200 to 400 Angstroms.

15. The method of claim 10, wherein said first titanium nitride layer is deposited using R.F. sputtering to a thickness between about 600 to 1500 Angstroms.

16. The method of claim 10, wherein said tungsten layer is deposited using LPCVD procedures, at a temperature between about 400 to 600° C., to a thickness between about 3000 to 7000 Angstroms.

17. The method of claim 10, wherein said tungsten plug is formed in said via hole opening, via an anisotropic RIE procedure, using $SF_6$ as an etchant, removing said first tungsten layer from the top surface of said first titanium nitride layer, in a region in which said first titanium layer overlays the top surface of said insulator layer.

18. The method of claim 10, wherein said second titanium nitride layer is deposited using R.F. sputtering, to a thickness between about 300 to 1000 Angstroms.

19. The method of claim 10, wherein said aluminum based layer is deposited using R.F. sputtering, to a thickness between about 2000 to 6000 Angstroms, containing about 0 to 2% copper.

20. The method of claim 10, wherein said local interconnect metal structure is formed via an anisotropic RIE procedure, using $Cl_2$ as an etchant for said aluminum based metal layer, for said second titanium nitride layer, for said first titanium nitride layer, and for said titanium layer.

* * * * *